United States Patent [19]

Nagata et al.

[11] Patent Number: 5,563,433
[45] Date of Patent: Oct. 8, 1996

[54] FRENCH-TYPE SEMICONDUCTOR MEMORY DEVICE WITH ENHANCED TRENCH CAPACITOR-TRANSISTOR CONNECTION

[75] Inventors: Toshiyuki Nagata, Tsukuba; Hiroyuki Yoshida, Ryugasaki; Takayuki Niuya, Tsukuba; Yoshihiro Ogata, Ibaraki, all of Japan

[73] Assignee: Texas Instruments Incorporated, Dallas, Tex.

[21] Appl. No.: 883,502

[22] Filed: May 15, 1992

[30] Foreign Application Priority Data

May 17, 1991 [JP] Japan .................................. 3-141451

[51] Int. Cl.$^6$ ................................................ H01L 27/108
[52] U.S. Cl. .......................... 257/301; 257/303; 257/382
[58] Field of Search .......................... 357/23.6 G, 59 K, 357/71 P, 55, 68; 437/52; 257/301, 303, 382

[56] References Cited

U.S. PATENT DOCUMENTS 4,999,689  3/1991  Iguchi ...................... 357/23.6
5,013,679  5/1991  Kumagai et al. ................ 437/60
5,075,248  12/1991  Yoon et al. ...................... 437/52

Primary Examiner—Robert P. Limanek
Attorney, Agent, or Firm—William E. Hiller; Richard L. Donaldson

[57] ABSTRACT

A type of semiconductor device with a configuration characterized by the fact that an electroconductive film (90) is formed beforehand in connection to step (54a) of insulating film (54), and an electroconductive layer (63) with step from the aforementioned electroconductive film is coated to form the side contact of the memory cell.

Even in the case when breakage takes place in electroconductive layer (63), the electrical conduction is still maintained via substrate electroconductive film (90), and no wire breakage, in effect, takes place. In addition, it is possible to form the pattern for the aforementioned electroconductive layer by, for instance, etching back method without applying a special mask; hence, the manufacturing process is simplified.

5 Claims, 6 Drawing Sheets

FRENCH-TYPE SEMICONDUCTOR MEMORY DEVICE WITH ENHANCED TRENCH CAPACITOR-TRANSISTOR CONNECTION

This invention concerns a type of semiconductor device, such as dynamic RAM (Ramdom Access Memory) and its manufacturing method.

PRIOR ART

In the conventional schemes, there are STT (Stacked in Trench) type cells in the semiconductor IC, such as dynamic RAM.

In order to form this type of cell, as shown in FIG. 17, CVD (Chemical Vapor Deposition) method or thermal oxidation method is used to grow a $SiO_2$ film with a thickness of about 400–1000 Å on the wall of a trench-shaped groove (20) formed on a P⁻-type silicon substrate (more specifically, a P⁻-type well), followed by selective etching of the $SiO_2$ film ((2) in the figure is a field $SiO_2$ film used for element separation).

Then, as shown in FIG. 18, on the entire surface including $SiO_2$ film (54), the CVD method is used to deposit an N⁺-type (by doping P or As) polysilicon film as the storage electrode with a thickness of about 500 Å. Then, annealing is carried out, and auto-doping of N-type impurity in polysilicon layer (63) is carried out from deleted portion (54a) of $SiO_2$ film (54) (that is, the window of side contact portion) to well (40), forming an N⁺-type impurity diffusion region (53) (side contact portion) in the upper portion of groove (20).

Then, as shown in FIG. 19, the entire surface of polysilicon layer (63) as the storage node, is etched back (anisotropic etching by RIE) with only a cylindrical-shaped polysilicon layer (63) left on the inner wall of groove (20) (however, the bottom-most portion is excluded). In addition, a $SiO_2$ film (not shown in the figure) as the dielectric film, is formed by CVD on the surface of said polysilicon layer (63), followed by formation of an N⁺-type polysilicon layer (not shown in the figure) by CVD, forming a capacitor.

However, in the etching-back process, as a step is formed in groove (20) due to presence of deleted portion (54a) of $SiO_2$ film (54), in the stage shown in FIG. 18, there is also step portion (63a) in polysilicon layer (63). As a result, for polysilicon layer (63), present as shown by the dot-dash line in FIG. 19, the portion of step (63a) is also etched, and polysilicon layer (63) is cut (line breakage) in groove (20).

In order to prevent this line breakage phenomenon, as shown in FIG. 20, photoresist (50) is filled in groove (20) to the deep level between the uppermost portion of groove (20) and step (63a) of polysilicon layer (63); with this photoresist used as a mask, the etching back operation is carried out for polysilicon layer (63) (that is, the portion of step (63a) is not etched in this case).

However, as photoresist (50) is to be left selectively on the aforementioned deep level, this task is itself rather difficult in consideration of the control property of the exposure state.

OBJECT OF THE INVENTION

An object of the present invention is to provide a type of semiconductor device and its manufacturing method, characterized by the fact that breakage of the electroconductive layer rarely takes place and that control can be carried out easily in the manufacturing process.

SUMMARY OF THE INVENTION

This invention provides a semiconductor device comprising a first electroconductive region (for example, N⁺ type region (53) described later) which is formed on a surface of a semiconductor substrate, an insulating film (for example, $SiO_2$ film (54) described later) which is formed on said surface and has opening portion on said first electroconductive region, a second electroconductive region (for example, polysilicon film (90) described later) which forms a protrusion portion that protrudes from an end portion of an insulating film opening portion on said insulating film, and a third electroconductive region (for example, polysilicon electrode (63) described later) which is formed with connection made with said first electroconductive region and said second electroconductive region via said protrusion portion; said third electroconductive region is formed at least in the region between said first electroconductive region and the protrusion portion of said second electroconductive region.

This invention also provides a manufacturing method of a semiconductor device comprising the stages of a stage in which a first electroconductive region is formed on the surface of a semiconductor substrate, a stage in which an insulating film having an opening portion on said first electroconductive region on said surface is formed, a stage in which a second electroconductive region with a protrusion portion protruding from the end portion of the insulating film opening portion on the said insulating film is formed, a stage in which a third electroconductive region which connects the said first electroconductive region and the said second electroconductive region via the said protrusion portion is formed, with the said third electroconductive region at least formed in the region between the said first electroconductive region and the said second electroconductive region.

Figure 1:
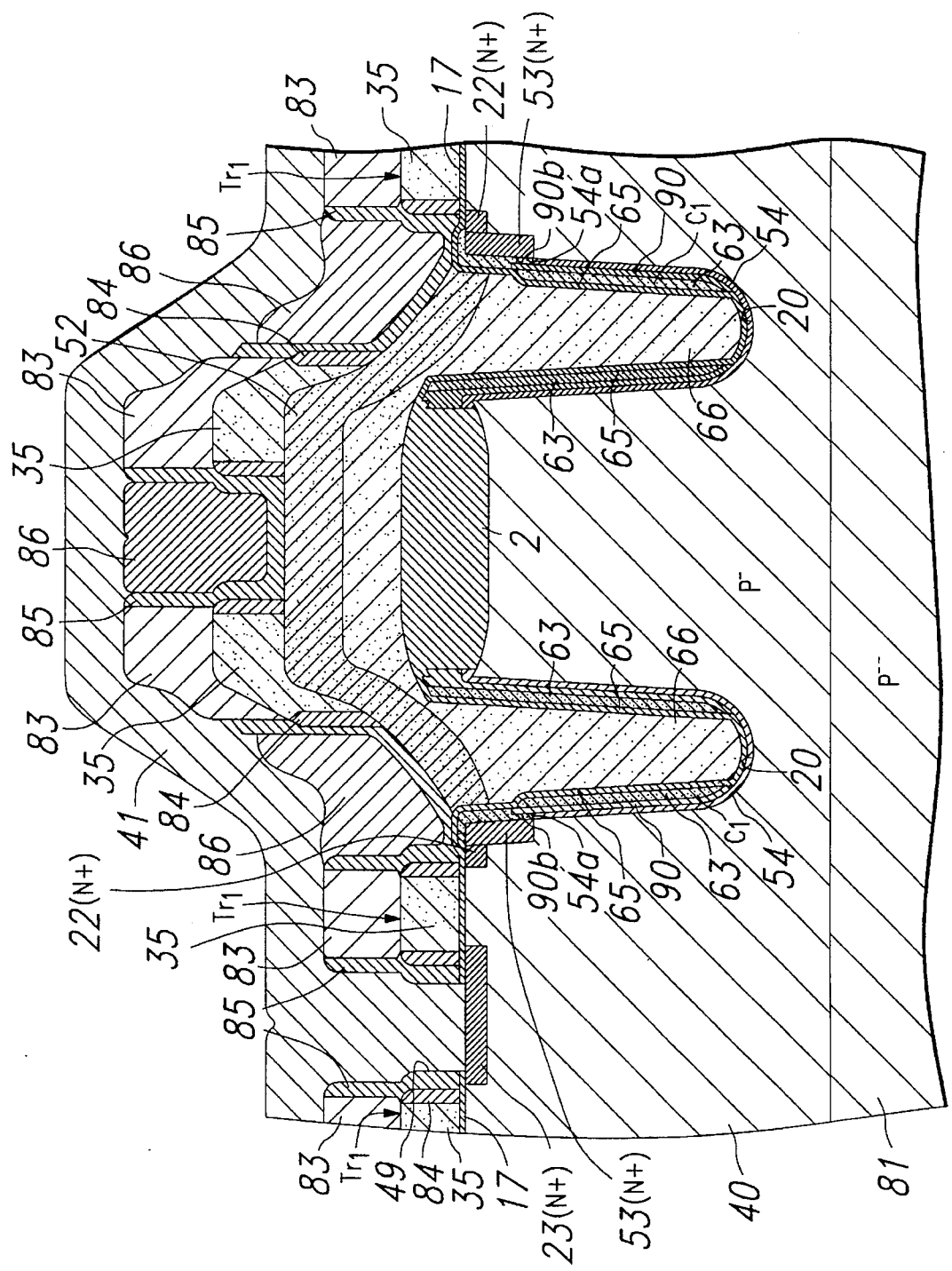
FIG. 1 is a cross-sectional view of the memory cell portion of the dynamic RAM in first embodiment of this invention.

2, field SiO$_2$ film
20, trench-shaped groove
22, 23, N$^+$-type diffusion region (source or drain region)
35, polysilicon gate electrode (word line)
40, substrate (P$^-$-type well)
41, bit line
52, SiO$_2$ film
53, N$^+$-type diffusion region (side contact portion)
54, SiO$_2$ film
54a, 110a, steps
63, polysilicon layer (storage node)
65, SiO$_2$ film (dielectric film)
66, polysilicon layer (field plate)
90, 120, electroconductive films
112, wiring
113, N$^+$-type diffusion region
Tr1: transfer gate
C1: capacitor

DESCRIPTION OF THE PREFERRED EMBODIMENTS

In the following, this invention will be explained with reference to embodiments.

Figure 2:
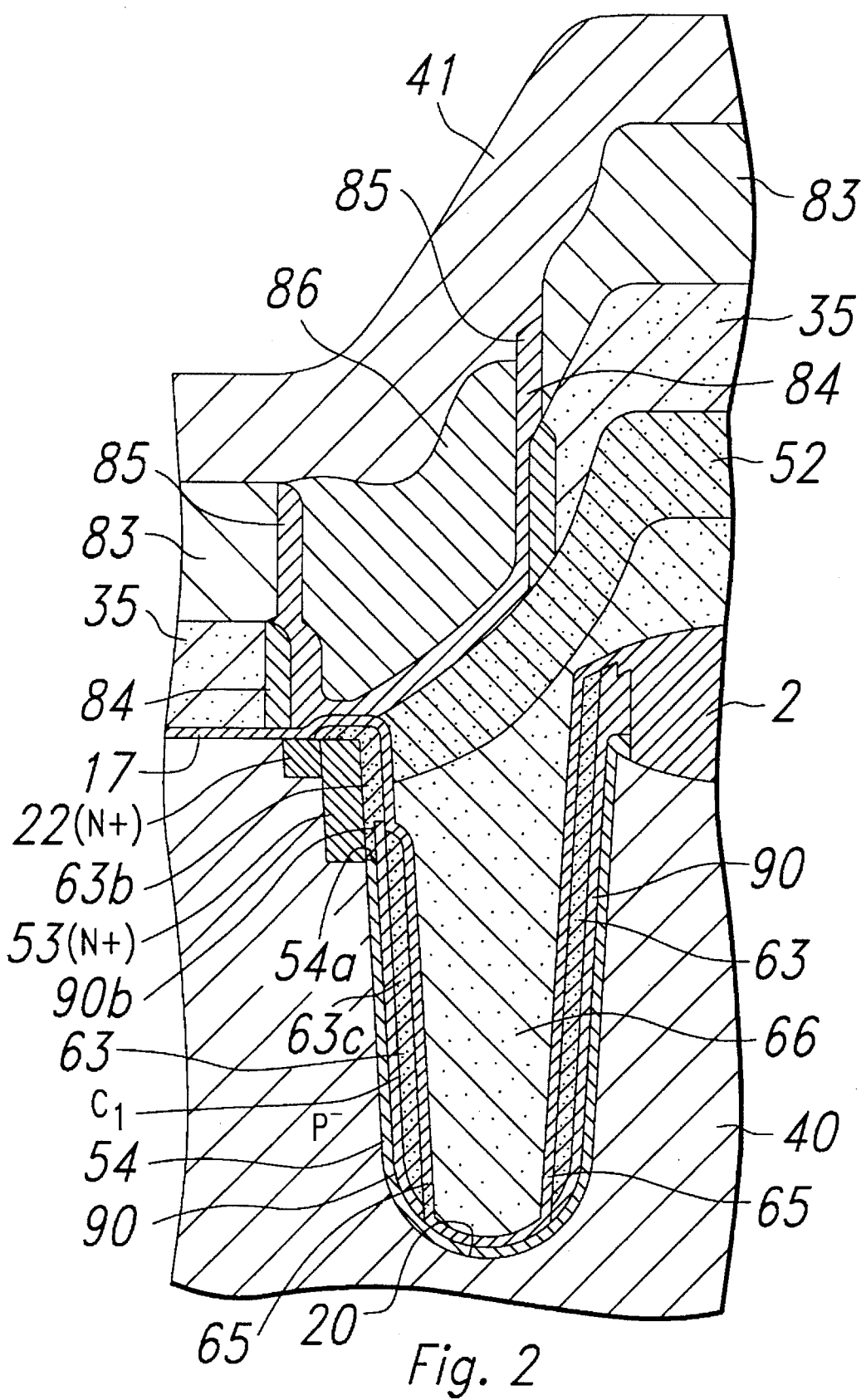
FIG. 2 is an enlarged cross-sectional view of the main portion of the memory cell of FIG. 1.

FIGS. 1 and 2 illustrate the dynamic RAM (such as a 64 MB RAM) formed in first embodiment of this invention.

For this dynamic RAM, the memory cells have a single transistor and single capacitor configuration, made of transfer gate Tr1, formed by an N-channel insulated gate field-effect transistor and capacitor C1 connected to source region (22) of the aforementioned transfer gate. Capacitor C1 is formed so as to be shared by the adjacent cells.

For the memory cell, a trench-shaped groove (20) is formed in a P$^-$-type well (40) formed on a principal surface of P$^-$-type semiconductor substrate (81); on the wall of this groove, an insulating film (54) with a thickness in the range of 200–1000 Å, such as 400 Å, is formed on the region excluding the side contact portion on the upper portion of the wall of the groove; there are also an N$^+$-type impurity diffusion region (53) formed on aforementioned one principal surface in the periphery of the aforementioned upper portion, and an N$^+$-type source region (22) formed on aforementioned one principal surface and is connected to said impurity diffusion region (53); with the aid of diffusion region (53), transfer gate Tr1 is connected to capacitor C1.

Capacitor C1 is formed of an N$^+$-type polysilicon electrode (63) which is formed in a cylindrical form on the wall of insulating film (54) connected to N$^+$-type impurity diffusion region (53), and a second N$^+$-type polysilicon electrode (66) which is formed via dielectric film (SiO$_2$ film) (65) formed on the wall of said polysilicon electrode (63). (The thickness of polysilicon electrode (63) is in the range of 200–1000 Å, for example, 500 Å is preferable.) Consequently, the area of the capacitor is large, and groove (20) can be well utilized; hence, this configuration is beneficial for realizing high output power and a high degree of integration.

A prominent feature of the configuration of capacitor C1 is that according to this invention, in connection to step (54a) formed of said SiO$_2$ film (54) (in the transverse direction in the figure), an electroconductive film (such as an N$^+$-type polysilicon film) (90) is formed as the substrate of storage polysilicon electrode (63) beforehand. Said polysilicon film (90) is formed in eaves form in contact with step (54a).

That is, on the wall surface of groove (20) including the surface of said polysilicon film (90) (from the surface to below step (54a)), storage polysilicon electrode (63) is formed (excluding the bottommost portion of groove (20)). In this configuration, even when step breakage takes place by etching back in polysilicon layer (63) as shown schematically in FIG. 20, electrical conduction takes place for the cut portions of polysilicon layer (63) through substrate polysilicon film (90), so that there is no breakage in the circuit. In order to obtain this effect, the thickness of polysilicon film (90) should be in the range of 300–1000 Å, for example, about 500 Å is preferable.

In addition, for example, two transfer gates Tr1 are formed for each cell region. They have a common bit line (41). N$^+$-type source region (22) and N$^+$-type drain region (23) connected to bit line (41) are formed in the predetermined pattern by diffusion. Between these regions, a polysilicon gate electrode (35) is formed as a word line on gate oxide film (17), and connection is made to an N-channel insulated gate field-effect transistor (transfer gate) Tr1 used for transverse-type transfer.

On field SiO$_2$ film (2), said polysilicon electrode (66) is formed between cells. On this polysilicon electrode, insulation from the upper portion is realized by SiO$_2$ film (52). In addition, on SiO$_2$ film (52), word lines (35) of other transfer gates are also formed.

In addition, in the upper portion of each word line (35), SiO$_2$ layer (83) is deposited in almost the same pattern. On the side portion, SiO$_2$ film (84) and SiO$_2$ film (85) are formed so that the various word lines are electrically separated from each other.

Bit line (41) is connected via contact hole (49) to N$^+$-type region (23). In the region outside the contact region, an Si$_3$N$_4$ layer (86) is deposited for burying between the word lines with a height similar to that of the word lines. On said Si$_3$N$_4$ layer (86) and SiO$_2$ layer (83), said bit line (41) is formed. However, it is also acceptable that the so-called interlayer insulating film is not formed.

Figure 20:
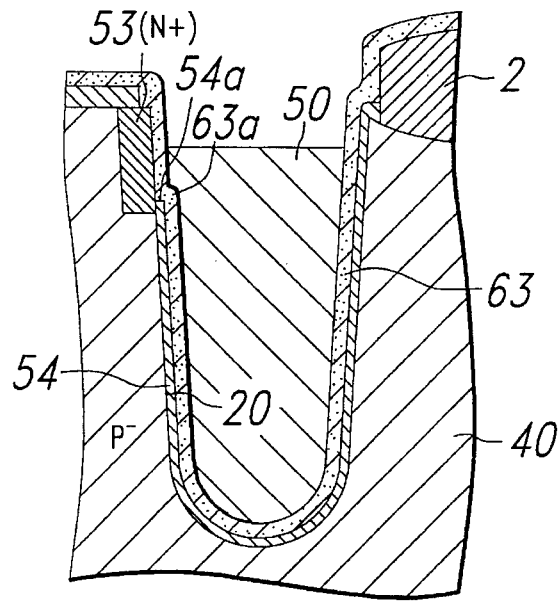
FIG. 20 is a cross-sectional view of the memory cell in a stage of manufacturing process of the aforementioned RAM.

In the device with the configuration explained above, with respect to the capacitor making use of trench-shaped groove (20) of the memory cell portion, a polysilicon film (90) as the substrate of storage polysilicon electrode (63) is formed in connection to step (54a) of SiO$_2$ film (54); hence, as shown in FIG. 20, even when breakage takes place in polysilicon layer (63) by the etching back of said layer, the cut portions of polysilicon layer (63) are well connected to each other electrically through substrate polysilicon film (90); hence, no line breakage takes place. This effect can be realized reliably as polysilicon layer (63) protrudes in eaves form from SiO$_2$ film (54).

As a result, it is possible to set storage polysilicon electrode (63) reliably, and a capacitor with a high performance and a high reliability can be obtained.

Polysilicon film (90) can be formed in a relatively simple way using the method to be explained later. In this way, the aforementioned prevention of step breakage of the storage electrode can be realized with a relatively simple configuration. There is no need to perform etching using the photoresist as explained in FIG. 21; hence, control of the manufacturing process of the device can be carried out easily.

In addition, in the aforementioned device, as bit line (41) is directly set on SiO$_2$ layer (83) with the same pattern on the gate electrode, there is no need to use the interlayer insulating film as used in the conventional scheme; hence, it is acceptable not to form contact holes on the interlayer insulating film (it is only necessary to remove by etching the bottom portion of SiO$_2$ film (85) between gate electrodes; this can be implemented in a self-aligning way by etching back operation).

In addition, as Si$_3$N$_4$ layer (86) with a height similar to that of SiO$_2$ film (83) is deposited for burying between the various gate electrodes on the region outside the contact region, it is possible to ensure a planarization including upper surface of the gate and insulation separation with the lower portion, and it is possible to make a direct forming of bit line (41) in the region from SiO$_2$ layer (83) to Si$_3$N$_4$ layer (86). As a result, the step coverage of bit line (41) is good, and the overall thickness of the insulating layer can be reduced.

In the following, the manufacturing method of the device in this example will be explained with reference to FIGS. 3–14.

Figure 3:
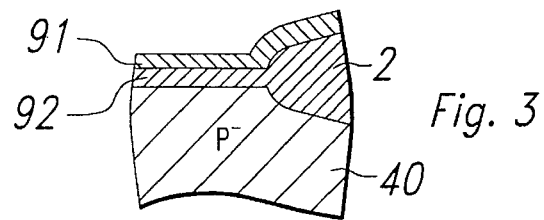
FIG. 3 is a cross-sectional view of the memory cell in a stage of the manufacturing process of the aforementioned RAM.

In the initial stage of the process, the conventional LOCOS (Local Oxidation of Silicon) method is used to form selectively field SiO$_2$ film (2) on P$^-$-type well (40) as shown in FIG. 3, followed by formation of a nitride layer (91) on the surface ((92) is a SiO$_2$ film in the figures).

Figure 4:
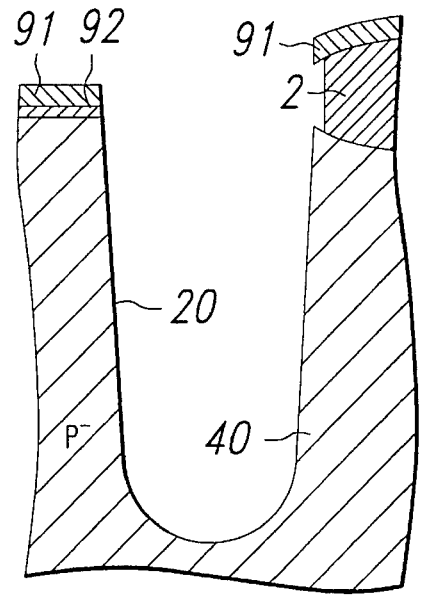
FIG. 4 is a cross-sectional view of the memory cell in a stage of the manufacturing process of the aforementioned RAM.

Then, as shown in FIG. 4, after nitride layer (91) is etched to the prescribed pattern, with nitride film (91) used as a mask, Substrate (40) is etched. In this way, in the memory cell portion, a trench-shaped groove (20) with a thickness of 3–7 μm is formed on substrate (40).

Figure 5:
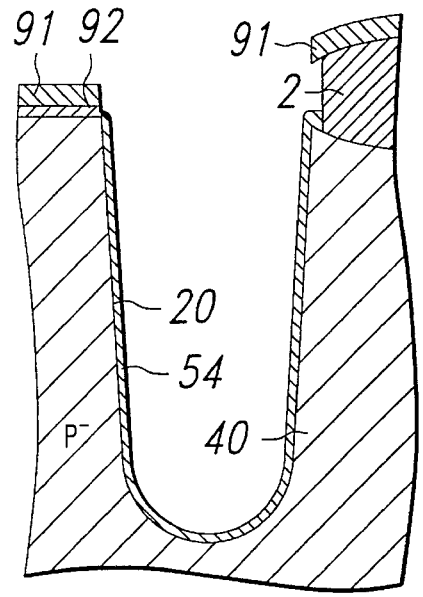
FIG. 5 is a cross-sectional view of the memory cell in a stage of the manufacturing process of the aforementioned RAM.

Then, as shown in FIG. 5, in the memory cell portion, the CVD (Chemical Vapor Deposition) method or thermal oxidation method is used to form a SiO$_2$ film (54) with a thickness of about 400 Å on the wall of groove (20). In FIG. 5 and the following figures, only a unit region is displayed. The same treatment is also carried out for the other regions.

Figure 6:
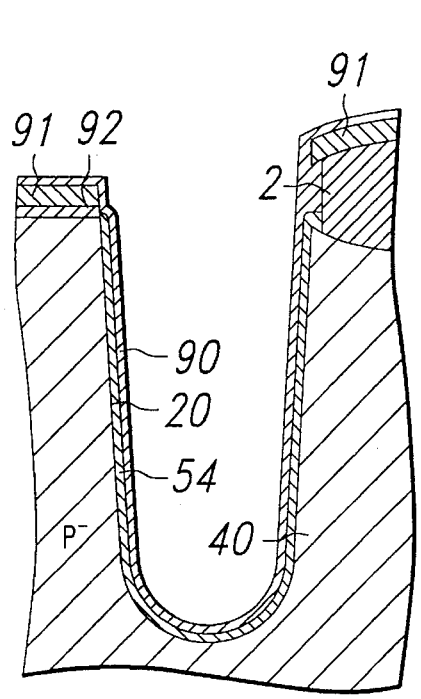
FIG. 6 is a cross-sectional view of the memory cell in a stage of the manufacturing process of the aforementioned RAM.

Then, as shown in FIG. 6, a polysilicon film (90) is formed on the entire surface using the CVD method.

Figure 7:
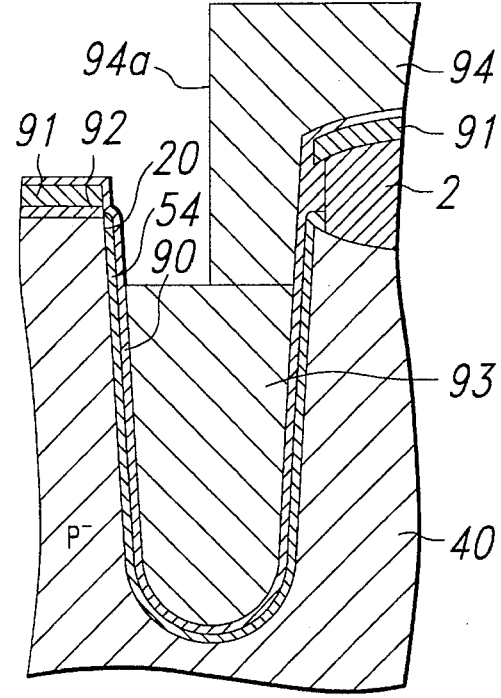
FIG. 7 is a cross-sectional view of the memory cell in a stage of the manufacturing process of the aforementioned RAM.

Then, as shown in FIG. 7, photoresist (93) is coated on the entire surface and fills groove (20), followed by etching with a predetermined depth of the photoresist left in groove (20). Then, the second layer of photoresist (94) is coated on the entire surface, followed by etching to the predetermined pattern, forming depleted portion (94a) for use as the side contact portion.

Figure 8:
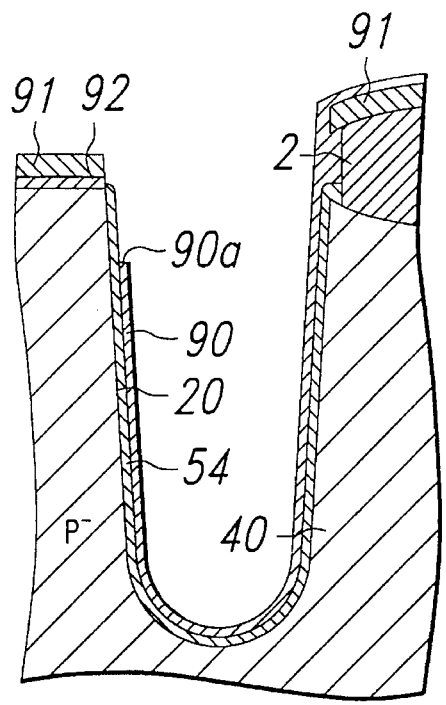
FIG. 8 is a cross-sectional view of the memory cell in a stage of the manufacturing process of the aforementioned RAM.

Then, as shown in FIG. 8, with photoresists (93), (94) in FIG. 7 used as the mask, etching is carried out for polysilicon film (90), and the polysilicon in the side contact portion is removed, forming depleted portion (90a).

Figure 9:
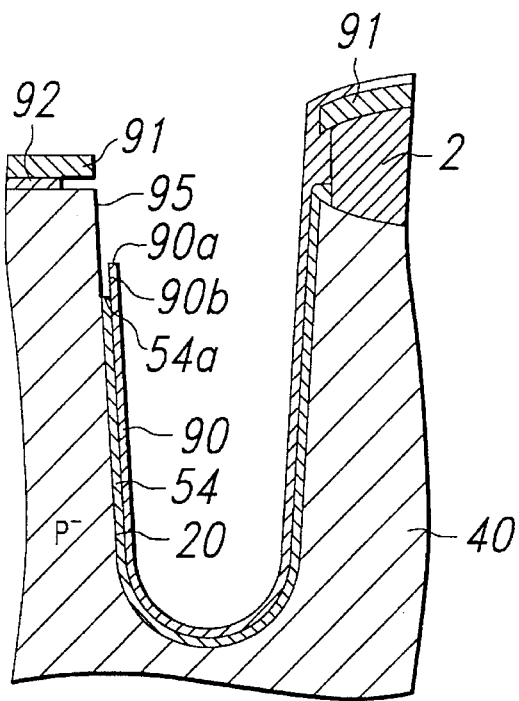
FIG. 9 is a cross-sectional view of the memory cell in a stage of the manufacturing process of the aforementioned RAM.

Then, as shown in FIG. 9, with polysilicon film (90) used as the mask, SiO$_2$ film (54) is etched, forming a side contact portion (95) without the SiO$_2$ film (exposed silicon surface) in the upper portion of groove (20). As a result, protrusion portion (90b) is formed, where SiO$_2$ film (54) is undercut a little below polysilicon film (90), and a predetermined step (54a) (about 400 Å) is formed in the portion with the silicon surface.

Figure 10:
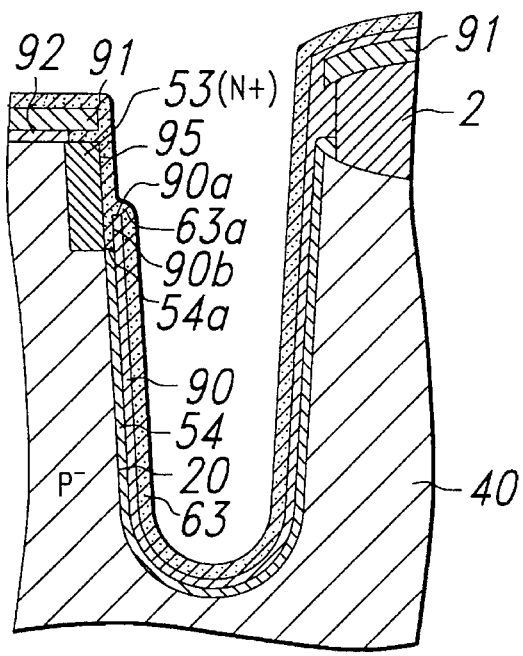
FIG. 10 is a cross-sectional view of the memory cell in a stage of the manufacturing process of the aforementioned RAM.

Then, as shown in FIG. 10, by using CVD, storage polysilicon layer (63), with a thickness of about 500 Å, is deposited on the entire surface. Polysilicon layer (63) is deposited on the portion from polysilicon film (90) to side contact portion (95) of said step (54a), and the aforementioned undercut portion of SiO$_2$ film (54) is also filled.

Then, by performing annealing, auto-doping is carried out for the N-type impurity from polysilicon film (90) to the silicon surface region at side contact portion (95), forming an N$^+$-type impurity diffusion region (53).

Figure 11:
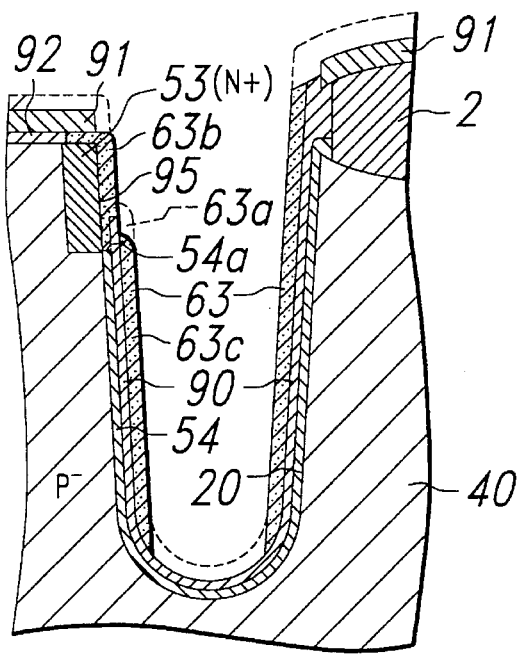
FIG. 11 is a cross-sectional view of the memory cell in a stage of the manufacturing process of the aforementioned RAM.

Then, as shown in FIG. 11, polysilicon film (63) is etched back using the RIE dry etching method, so that the portion indicated by the broken line is removed, leaving the storage node portion. In this case, step portion (63a) of polysilicon film (63) is removed, and polysilicon film (63) is separated into portions (63b) and (63c). However, as electrical conduction is maintained between the two portions (63b) and (63c) by polysilicon film (90), no line breakage phenomenon takes place for polysilicon film (63).

Figure 12:
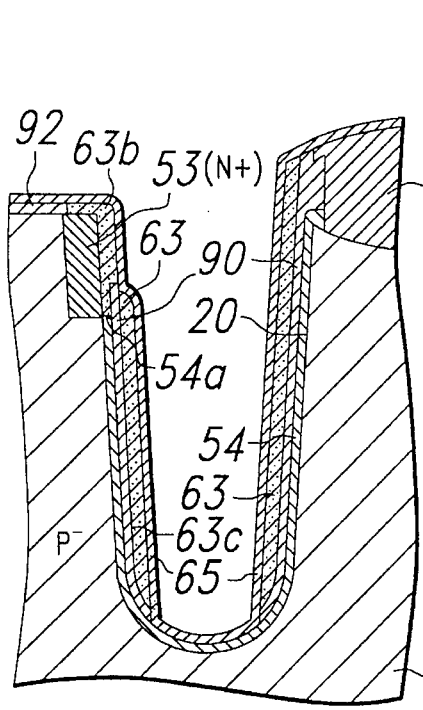
FIG. 12 is a cross-sectional view of the memory cell in a stage of the manufacturing process of the aforementioned RAM.

Then, as shown in FIG. 12, after nitride film (91) is removed by etching, CVD is used to grow SiO$_2$ film (65) uniformly on the entire surface (including groove (20)).

Figure 13:
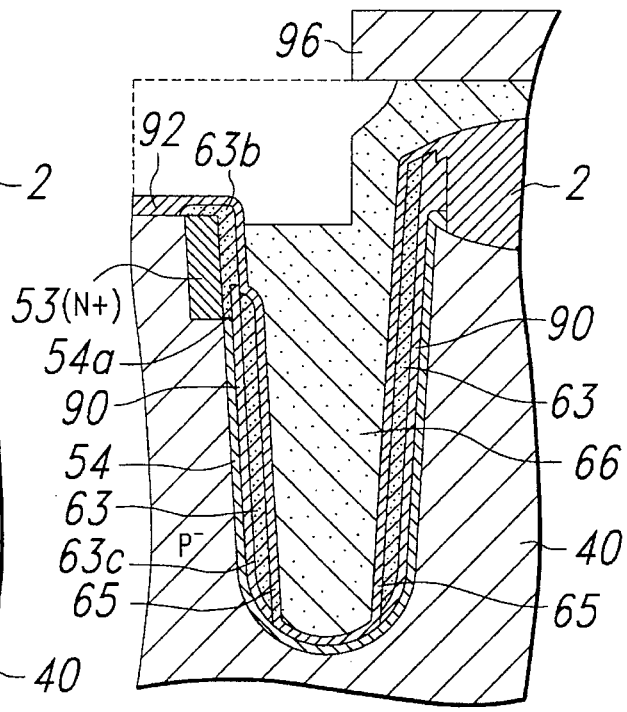
FIG. 13 is a cross-sectional view of the memory cell in a stage of the manufacturing process of the aforementioned RAM.

Then, as shown in FIG. 13, after CVD is used to deposit polysilicon layer (66) on the entire surface including groove (20), with the aid of photoresist (96) with the predetermined pattern, polysilicon layer (66) is wet-etched from the level of the broken line, and the upper portion of groove (20) is removed using the anisotropic dry etching method, leaving polysilicon layer (66) as a field plate to connect adjacent grooves (20)—(20). In the upper portion, undercut is carried out and the edge portion is removed obliquely so as to reduce the step magnitude.

Figure 14:
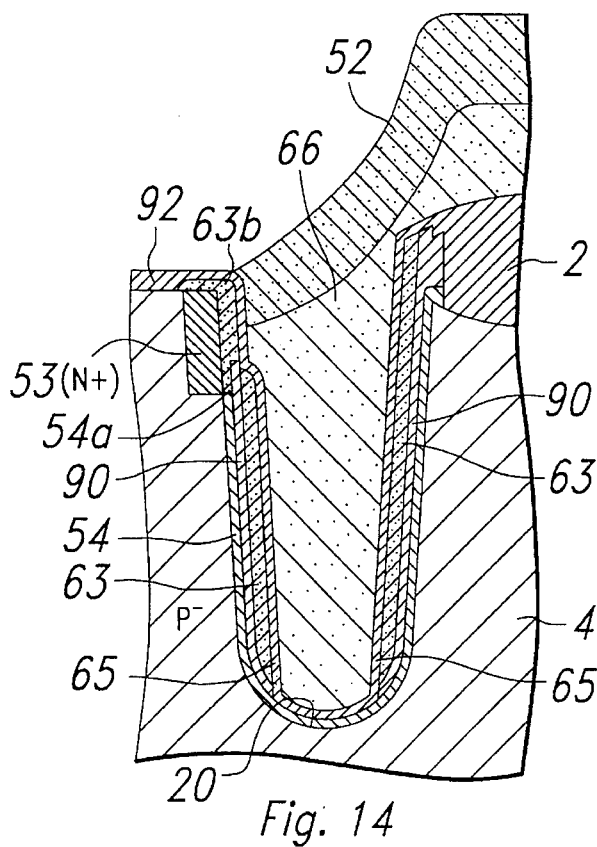
FIG. 14 is a cross-sectional view of the memory cell in a stage of the manufacturing process of the aforementioned RAM.

Then, as shown in FIG. 14, the thermal oxidation technique is used to oxidize the surface of polysilicon layer (66), on which a SiO$_2$ layer (52) is grown.

In the later stage, after the entire surface is etched, the thermal oxidation method is used to form a gate oxide film (17), followed by deposition in sequence polysilicon layer (35) and SiO$_2$ layer (83) using the CVD method on the entire surface. Then, these two layers are etched to the same pattern, followed by deposition of polysilicon gate electrode (35) and SiO$_2$ layer (83) as shown in FIGS. 1 and 2. Then, ion implantation is carried out to implant an N-type impurity, forming N$^+$-type regions (22), (23).

After growth of side wall SiO$_2$ film (84), a SiO$_2$ film (85) is formed on the entire surface, and a nitride layer (86) is etched back so as to be buried between gates. Then, the bottom portion of SiO$_2$ film (85) on N$^+$-type region (23) for the bit line is removed by etching to form contact hole (49). Then, the bit line wiring material (such as polysilicon) is deposited, followed by patterning to form bit line (41).

In the manufacturing method explained above, in order to prevent step breakage of the storage node, in the stages shown in FIGS. 6–8, polysilicon film (90) is formed as the base film. In the stage shown in FIG. 9, with polysilicon film (90) used as a mask, a window of the side contact portion is formed. In the stage shown in FIG. 10, storage polysilicon layer (63) is formed on polysilicon film (90) so that step (54a) of SiO$_2$ film (54) is buried; hence, as shown in FIG. 11, even when breakage takes place in polysilicon layer (63) in the stage when this layer is etched, the storage node itself is still connected via polysilicon film (90) (that is, there is virtually no breakage).

Consequently, it is possible to prevent breakage of the storage node with good reproducibility. In addition, for the manufacturing process, as shown in FIG. 20, there is no need to perform etching of the polysilicon of the storage node, and the conventional etching operation may be applied with good results; the well controlled manufacturing process can be easily achieved.

Figure 15:
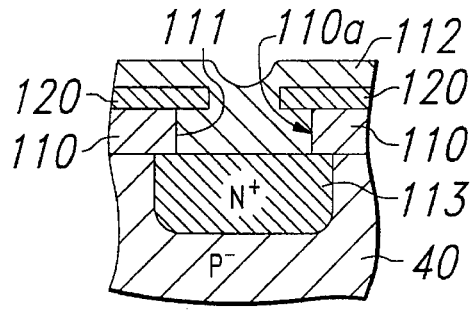
FIG. 15 is a cross-sectional view of the main portion of the device in second embodiment of this invention.
Figure 16:
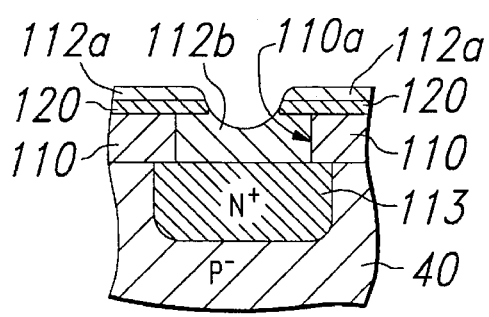
FIG. 16 is a cross-sectional view of a stage of the manufacturing process of the aforementioned device.
Figure 17:
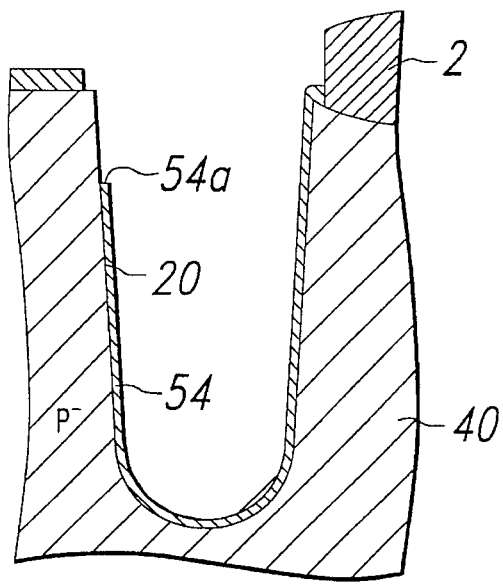
FIG. 17 is a cross-sectional view illustrating a stage of manufacturing process of dynamic RAM in the conventional scheme.
Figure 18:
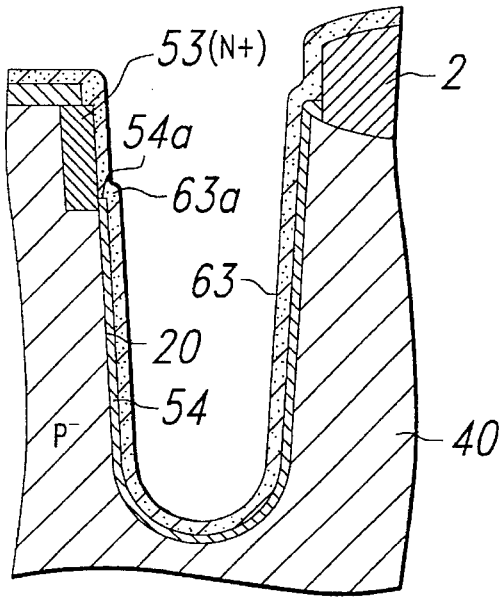
FIG. 18 is a cross-sectional view of the memory cell in a stage of manufacturing process of the aforementioned RAM.
Figure 19:
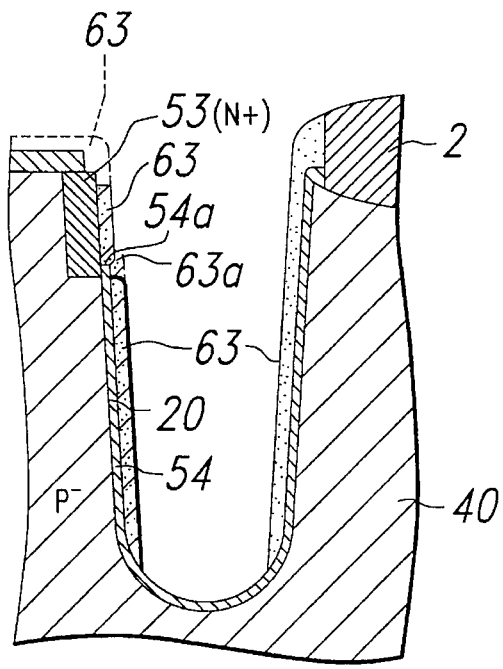
FIG. 19. is a cross-sectional view of the memory cell in a stage of manufacturing process of the aforementioned RAM.

FIGS. 15 and 16 illustrate second embodiment of this invention.

In this embodiment, an N$^+$-type impurity diffusion layer (113) is formed on substrate (40), and a SiO$_2$ protective film (110) is formed on the surface of the substrate, with contact hole (111) covered by wiring (112). In this configuration, on step (110a) formed by protective film (110), an electroconductive film (120) is formed beforehand, and wiring (112) (such as polysilicon film) is applied on it.

Consequently, suppose as shown in FIG. 16, breakage indicated by (112a) and (112b) takes place when wiring (112) is formed: the two portions are still connected to each other electrically via electroconductive film (120), and there is virtually no breakage of the wiring.

In order to form the configuration shown in FIG. 15, CVD is used to deposit SiO$_2$ film (110) and electroconductive film (120) on the substrate; after the predetermined pattern is formed for electroconductive film (120), wet-etching is carried out for SiO$_2$ film (110), leaving electroconductive film (120) in the form of eaves. Then, forming of the wiring material and etching are carried out in sequence.

In the above, this invention was explained with reference to embodiments. However, various variations are allowed for the aforementioned embodiments as long as the basic points of this invention are observed.

For example, said electroconductive films (90), (63), (112), and (120) are made of polysilicon. However, they may also be made of various silicides (silicides of W, Al, Ti, Mo, etc.) and other electroconductive materials. In addition, it is also possible to adopt various variations for the shapes. The electroconductive film may be either monolayered or multilayered.

Various other methods may be adopted to form the aforementioned insulating films (such as (54)) and electroconductive films (such as (90)). In some cases, it is also possible to form the electroconductive film after formation of the step on the insulating film.

This invention is applicable for the high-integration dynamic RAM and other semiconductor ICs with the aforementioned configuration.

As explained above, in this invention, a second electroconductive region having a protrusion portion is formed beforehand on the first electroconductive region, and a third electroconductive region that connects the first and second electroconductive regions is formed; hence, even when breakage takes place in the electroconductive region, the electrical conduction state can still be maintained via the second electroconductive region, and wire breakage, in effect, does not take place.

For the aforementioned third electroconductive region, after coating with the step from the aforementioned first electroconductive region, etching back is carried out without applying any special mask to form the pattern. This operation can be implemented; hence, it is possible to prevent wire breakage of the third electroconductive region by the aforementioned second electroconductive region. Consequently, well controlled manufacturing process can be easily achieved.

What is claimed is:

1. A semiconductor integrated circuit device comprising:

semiconductor substrate means including a substrate component of at least a first conductivity type;

said semiconductor substrate means being provided with a vertical trench extending thereinto from the top surface thereof;

a first liner of insulation material bounding the vertical trench provided in said semiconductor substrate means, said first liner of insulation material on one side of the vertical trench terminating below the top surface of said semiconductor substrate means so as to define one end portion of said first liner of insulation material below and in vertically spaced relation to the top surface of said semiconductor substrate means;

a second liner of insulation material within the vertical trench provided in said semiconductor substrate means and disposed in inwardly spaced relationship with respect to said first liner of insulation material, said second liner of insulation material covering the complete extent of the vertical trench;

an electrode substrate of conductive material disposed on said first liner of insulation material and bounding the vertical trench provided in said semiconductor substrate means, said electrode substrate of conductive material having a protrusion portion extending above said one end portion of said first liner of insulation material but in vertically spaced relation to the top surface of said semiconductor substrate means;

an electrode layer of conductive material disposed on said electrode substrate of conductive material in overlying relationship along the extent of said electrode substrate of conductive material, said electrode layer of conductive material gaging said electrode substrate of conductive material along the length of said protrusion portion thereof, said electrode layer being further disposed in engagement with said one end of said first liner of insulation material and extending upwardly to the top surface of said semiconductor substrate means to define an electrode contact portion above said one end of said first layer of insulation material;

said electrode substrate and said electrode layer cooperating to provide a first electrode filling the space in said vertical trench defined between said first and second liners of insulation material;

conductive material filling the space in the vertical trench within said second liner of insulation material and providing a second electrode;

said first and second electrodes and said second liner of insulation material defining a trench capacitor in which said first and second electrodes are capacitor plates and the second liner of insulation material is a dielectric layer therebetween;

a field-effect transistor provided in said semiconductor substrate means;

means electrically connecting said field-effect transistor to said trench capacitor via said electrode contact portion of said electrode layer of said first electrode of said trench capacitor; and said trench capacitor and said field-effect transistor defining a memory cell.

2. A semiconductor integrated circuit device as set forth in claim 1, wherein the field-effect transistor of said memory cell includes spaced source and drain regions of a second conductivity type disposed in said semiconductor substrate means and opening onto the top surface thereof;

a portion of said semiconductor substrate means of said first conductivity type disposed between said source and drain regions of the second conductivity type defining a channel region;

a gate electrode of conductive material disposed above said channel region;

a layer of insulation material interposed between said gate electrode and said channel region and defining a gate insulator; and said means electrically connecting said field-effect transistor to said trench capacitor including a region of the second conductivity type disposed in said semiconductor substrate means of said first conductivity type connected to said source region and extending from said source region into engagement with said electrode contact portion of said electrode layer forming part of said first electrode providing a capacitor plate of said trench capacitor to connect said field-effect transistor to said trench capacitor of said memory cell.

3. A semiconductor integrated circuit device as set forth in claim 2, wherein said semiconductor substrate means comprises a semiconductor substrate of said first conductivity type, and a layer of semiconductor material of said first conductivity type but of increased dopant concentration in relation to said substrate overlying said substrate of said first conductivity type;

said vertical trench extending partially through said layer of semiconductor material of said first conductivity type, but stopping short of said semiconductor substrate of said first conductivity type.

4. A semiconductor integrated circuit device comprising:

semiconductor substrate means including a substrate component of at least a first conductivity type;

said semiconductor substrate means being provided with a plurality of vertical trenches extending thereinto from the top surface thereof and disposed in spaced relationship with respect to each other;

a plurality of memory cells respectively corresponding to the plurality of vertical trenches, each of said memory cells including a capacitor and a field-effect transistor;

each of said memory cells included in said semiconductor substrate means being associated with a respective one of said plurality of vertical trenches;

a first liner of insulation material bounding the vertical trench included in each of the memory cells, said first liner of insulation material on one side of the vertical trench terminating below the top surface of said semiconductor substrate means so as to define one end portion of said first liner of insulation material below and in vertically spaced relation to the top surface of said semiconductor substrate means;

a second liner of insulation material within the vertical trench included in each of the memory cells and disposed in inwardly spaced relation to said first liner of insulation material, said second liner of insulation material covering the complete extent of the vertical trench;

an electrode substrate of conductive material disposed on said first liner of insulation material and bounding the vertical trench included in each of the memory cells, said electrode substrate of conductive material having a protrusion portion extending above said one end portion of said first liner of insulation material, but in vertically spaced relation to the top surface of said semiconductor substrate means;

an electrode layer of conductive material disposed on said electrode substrate of conductive material in overlying relationship along the extent of said electrode substrate of conductive material, said electrode layer of conductive material engaging said electrode substrate of conductive material along the length of said protrusion proportion thereof, said electrode layer being further disposed in engagement with said one end of said first liner of insulation material and extending upwardly to the top surface of said semiconductor substrate means to define an electrode contact portion above said one end of said first layer of insulation material;

said electrode substrate and said electrode layer cooperating to provide a first electrode filling the space in said vertical trench defined between said first and second liners of insulation material;

conductive material filling the space in the vertical trench within said second liner of insulation material and providing a second electrode;

said first and second electrodes, and said second liner of insulation material defining a trench capacitor of each of said memory cells in which said first and second electrodes are capacitor plates and said second liner of insulation material is a dielectric layer therebetween; and means electrically connecting each of said field-effect transistors to the trench capacitor corresponding thereto in providing a memory cell via said electrode contact portion of said electrode layer of said first electrode of said trench capacitor.

5. A semiconductor integrated circuit device as set forth in claim 4, wherein said conductive material filling the space in the vertical trench within said second liner of insulation material in one of said memory cells is integral with the conductive material filling the space in an adjacent vertical trench within said second liner of insulation material of another memory cell.

* * * * *

UNITED STATES PATENT AND TRADEMARK OFFICE
CERTIFICATE OF CORRECTION

PATENT NO.   : 5,563,433
DATED        : October 8, 1996
INVENTOR(S)  : Toshiyuki Nagata, et. al.

It is certified that error appears in the above-indentified patent and that said Letters Patent is hereby corrected as shown below:

Title page, item [54] and col. 1, Title should read as following:

-- TRENCH-TYPE SEMICONDUCTOR MEMORY DEVICE WITH ENHANCED TRENCH --
CAPACITOR-TRANSISTOR CONNECTION

Signed and Sealed this

Twenty-first Day of October 1997

Attest:

BRUCE LEHMAN

Attesting Officer

Commissioner of Patents and Trademarks